(12) United States Patent
Cheng et al.

(10) Patent No.: US 6,695,921 B2
(45) Date of Patent: Feb. 24, 2004

(54) HOOP SUPPORT FOR SEMICONDUCTOR WAFER

(75) Inventors: Hsi-Kuei Cheng, Hsinchu (TW); Ting-Chu Wang, Taoyuan (TW); Yu-Ku Lin, Hsin-chu (TW); Chin-Te Huang, Hsin-Chu (TW); Huai-Tei Yang, Hsin-Chu (TW); Chun-Chang Chen, Dali (TW); Yi-Lang Wang, Tai-Chung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/170,957

(22) Filed: Jun. 13, 2002

(65) Prior Publication Data

US 2003/0230237 A1 Dec. 18, 2003

(51) Int. Cl.$^7$ ................................................. B05C 13/02
(52) U.S. Cl. ........................ 118/500; 118/728; 269/903; 156/345

(58) Field of Search ................................ 118/500, 728, 118/52, 56; 204/298.15; 134/902; 269/903; 156/345

(56) References Cited

U.S. PATENT DOCUMENTS

| 6,149,727 A | * | 11/2000 | Yoshioka et al. | 118/500 |
| 6,217,663 B1 | * | 4/2001 | Inokuchi et al. | 118/728 |
| 6,520,191 B1 | * | 2/2003 | Iwamoto et al. | 134/184 |

* cited by examiner

*Primary Examiner*—Laura Edwards
(74) *Attorney, Agent, or Firm*—Tung & Associates

(57) ABSTRACT

An improved hoop support for semiconductor wafers reduces contamination of the wafer during edge beveling operations through the use of support pins that make only line contact with the wafer. The support pins are spaced around the periphery of the hoop and possess a triangular cross section. Two intersecting sides of the pins form an edge that defines the line contact with the wafer. These intersecting sides are preferably inclined relative to the wafer at an angle of between 60 and 80 degrees.

13 Claims, 3 Drawing Sheets

HOOP SUPPORT FOR SEMICONDUCTOR WAFER

TECHNICAL FIELD

The present invention broadly relates to semiconductor manufacturing equipment, and deals more particularly with a hoop support for supporting semiconductor wafer within a processing chamber.

BACKGROUND OF THE INVENTION

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of the interconnect features is very important to the success of ULSI and to the continued efforts to increase circuit densities and quality on individual substrates and die. As circuit densities increase, the widths of vias, contacts, and other features, as well as the dielectric material between them, decrease to less than 250 nm, whereas the thicknesses of the dielectric layers remain substantially constant, with the result that the aspect ratios for the features decrease.

Copper and its alloys are being used with increased frequency to form lines and plugs in semiconductor processing, primarily because it exhibits lower resistivity than aluminum and significantly higher electro-migration of resistance as compared to aluminum. These characteristics are important for supporting higher current densities experienced at high levels of integration and increased device speed. Copper also has good thermal conductivity and is available in a highly pure state. Therefore, copper is becoming a choice metal for filling sub quarter micron high aspect ratio interconnect features on semiconductor substrates.

Metal electroplating is generally known and can be achieved using a variety of techniques. A typical method generally comprises physical vapor depositing a barrier layer on the feature surfaces, physical vapor depositing a conductive metal seed layer, preferably copper over the barrier layer, and then electroplating a conductive metal over the seed layer to fill the structure/feature. Finally, the deposited layers and the dielectric layers are planarized, such as by chemical mechanical polishing (CMP) to define a conductive interconnect feature.

One problem encountered in electroplating processes, sometimes referred to as electrochemical plating (ECP), is that the edge of the seed layer receives an excessive amount of deposition, typically referred to as an edge bead, during the electroplating process. The edge of the seed layer receives a higher current density than the remainder of the seed layer, resulting in a higher rate of deposition at the edge of the seed layer. The mechanical stress at the edge of the seed layer is also higher than the remaining of the seed layer, causing the deposition at the edge of the seed layer to pull up and away from the edge of the wafer.

Specialized equipment has been designed to remove the edge bead layer, which can be often combined with other processing equipment in a single station. For example, U.S. Pat. No. 6,267,853 issued Jul. 31, 2001, the entire contents of which are incorporated herein by reference, discloses a sophisticated electrochemical deposition system that includes automated stations for performing electrochemical deposition edge bead removal and spin/rinse/dry, rapid thermal annealing and seed layer repair. Edge bead removal is typically accomplished by spraying an etching solution on the edge of the wafer as the wafer is spun. The etching solution is dispensed at an angle to the wafer so that as the bead is removed, a bevel is formed on the wafer edge, and thus the process is sometimes referred to as "edge bevel removal" (EBR). EBR is carried out in an EBR chamber. The wafer is temporarily stored in the EBR chamber between processing operations using a hoop support having a plurality of pins that contact and support the wafer.

The pins directly contact the patterned side of the wafer. It has been found that a number of defects in the wafer often occur at the outer periphery of the wafer in the area of the pins. It has been determined that these defects are the result of impurities and contamination on the pins which are transferred to the surface of the wafer. These surface impurities are apparently the result of copper and other chemical impurities remaining on the pins after prior EBR processing of preceding wafers. It would therefore be desirable to provide supports that reduce the opportunity for copper and other chemical impurities and contaminants to be transferred to the surface of the wafer during EBR processing. The present invention is intended to provide this solution.

SUMMARY OF THE INVENTION

The present invention provides apparatus for supporting a semiconductor wafer between etching operations in which material is etched from the periphery of a wafer. The apparatus includes a hoop like structure, and a plurality of supports carried on the hoop for supporting a wafer thereon. Each of the supports is in the form of a pin having an edge that contacts and supports the wafer along the line of contact to provide adequate lateral support of the wafer while minimizing the contact area between the wafer and the supports. In a preferred form, the pins comprise a base and a pair of converging sides forming a triangular cross-section. The converging sides intersect to form the edge that contacts the wafer along a line. The pins are circumferentially spaced around the perimeter of the hoop and are arranged such that the line of contact with the wafer presents extends radially inward toward the center of the wafer. The angle of each of the sides defining the contact edge relative to the wafer is preferably between 60° and 80°. The sharp angle of the incidence of the sides of the pins, combined with a minimal contact area with the wafer, serve to reduce the opportunity for contaminants being carried on the pins that can be transferred to the wafer surface.

Accordingly, it is a primary object of the invention to provide a hoop for holding a semiconductor wafer in the processing chamber used to perform edge bevel removal operations.

It is a further operation of the intention to provide apparatus as described above which includes hoop supports that reduce the contact area between the hoop and the wafer.

A further object of the invention is to provide apparatus of the type mentioned which includes inclined surface features that reduce the opportunity for contaminants to adhere to the sides of the supports.

These, and further objects and advantages of the invention will be made clear or will become apparent during the course of the following description of the preferred embodiment of the invention.

BRIEF DESCRIPTION OF THE DRAWINGS

In the drawings, which form an integral part of the specifications, and are to be read in conjunction therewith, in which like reference numerals are employed to designate identical components in the various views.

DESCRIPTION OF THE PREFERRED EMBODIMENT

Figure 1:
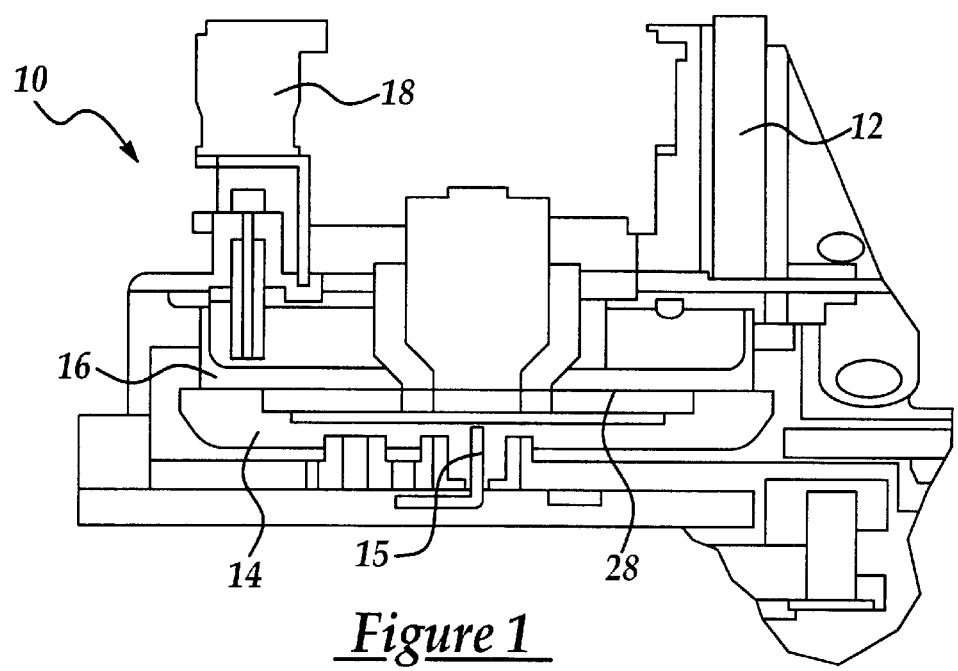
FIG. 1 is a cross-sectional view of a combined edge bevel removal and spin/rinse/dry chamber.
Figure 2:
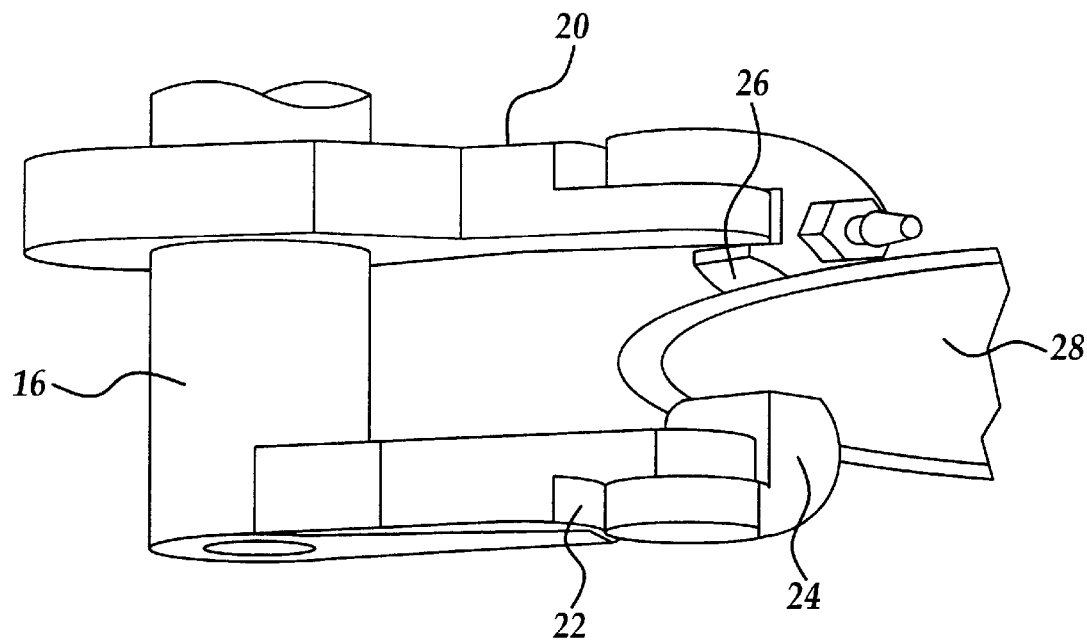
FIG. 2 is a perspective view of an etchant dispenser shown in operative relationship to a wafer, forming a part of the chamber shown in FIG. 1.

Referring first to FIGS. 1 and 2, a processing chamber, generally indicated by the numeral 10 performs combined bevel removal and spin/dry/rinse operations on a semiconductor wafer 28. The station 10 includes a spindle lift 12, a dispensing arm 16 driven by a motor 18 and a hoop support 14 for supporting a wafer 28 thereon. The dispensing arm 16 includes a pair of lateral extensions 20, 22 having dispensing nozzles 24, 26 at the outer ends thereof which are respectively positioned below and above the outer periphery of a spinning wafer 28. The nozzles 24, 26 are oriented such that the stream of etching solution dispensed thereby impinges the outer edges of the wafer 28 at an acute angle, so as to etch a bevel on the peripheral edges of the wafer 28. Following the etching process in which a bevel is created on the edge of the wafer 28, various other components forming part of the chamber 10 perform a spin/rinse/dry operation in which de-ionized water is sprayed on the wafer 28 to wash away residue from the etching operations, following which the wafer is spun dry. The various components of the station 10 for carrying out the etching and subsequent processes are well known in the art as exemplified by U.S. Pat. No. 6,267,853 mentioned above.

Figure 3:
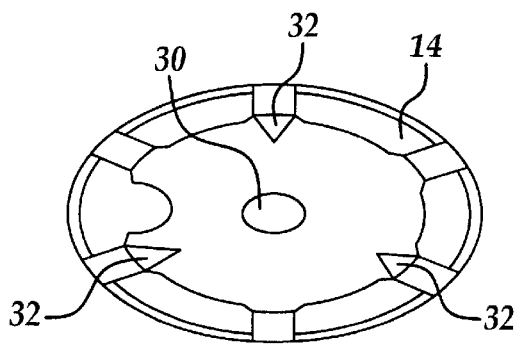
FIG. 3 is a perspective view of a prior art hoop support.
Figure 4:
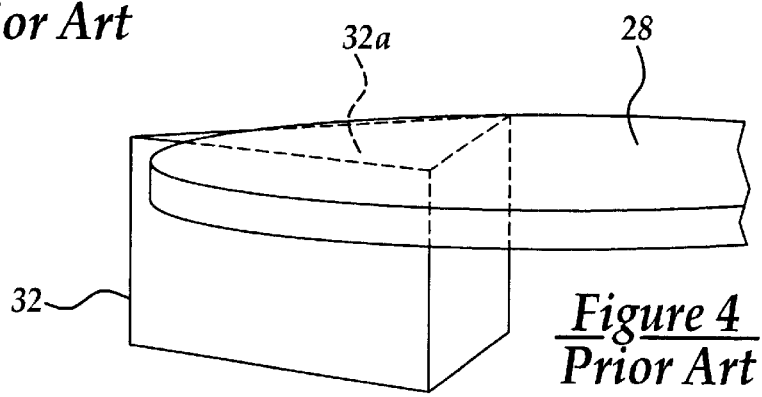
FIG. 4 is an enlarged view, showing one of the supports forming part of the hoop in FIG. 3, in operative relationship to a wafer.

A conventional prior art hoop support is shown in FIG. 3. The hoop support of FIG. 3 is generally circular in shape, and includes a central aperture 30 to allow a rinse solution to pass therethrough and reach the bottom side of the wafer 28 which is dispensed by a rinsing nozzle 15 (FIG. 1). Hoop support 14 includes 3 circumferentially spaced supports in the form of pins 32 which are triangularly shaped when viewed in plan and have upper flat surfaces 32a which contact and support the wafer 28 thereon, as best seen FIG. 4. As a result of the fact that the flat surfaces 32a contact a substantial portion of the patterned bottom surface of the wafer 28, there is opportunity for contaminants and impurities to adhere to surface 32a, as successive batches of the wafers 28 are processed. Cleaning solvents and CuSO$_4$ solution are particularly prone to adhere to the pins 32 and thus form a contaminating residue which can increase wafer defects. Moreover, the flat side walls of pins 32, which extend perpendicular to the bottom surface of the wafer 28, provide further surface areas that can collect contaminants and impurities which are later transferred to the surface of wafer 28 and cause later processing defects.

Figure 5:
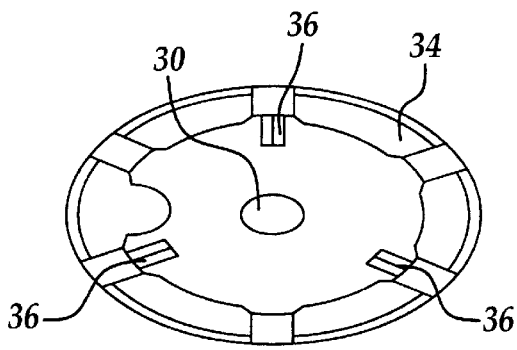
FIG. 5 is a perspective view of the hoop support of the present invention.
Figure 6:
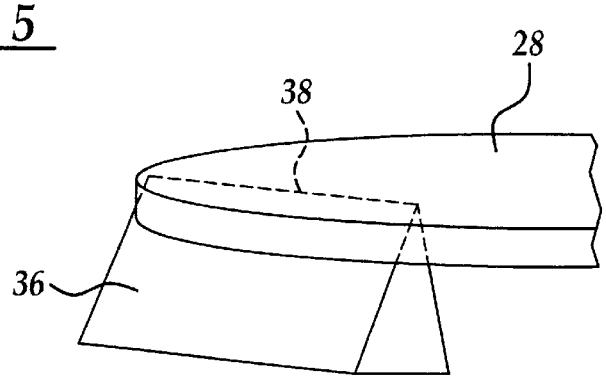
FIG. 6 is a perspective view showing one of the supports of FIG. 5 in operative relationship to a wafer.
Figure 7:
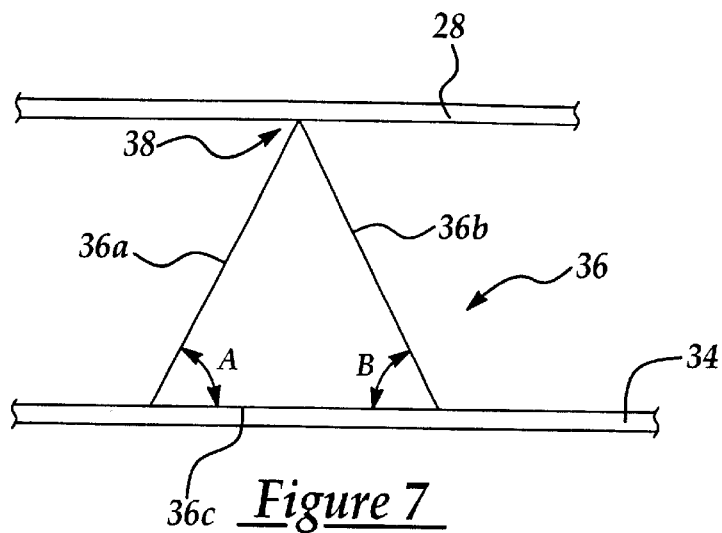
FIG. 7 is a fragmentary, end view of the support shown in FIG. 6.
Figure 8:
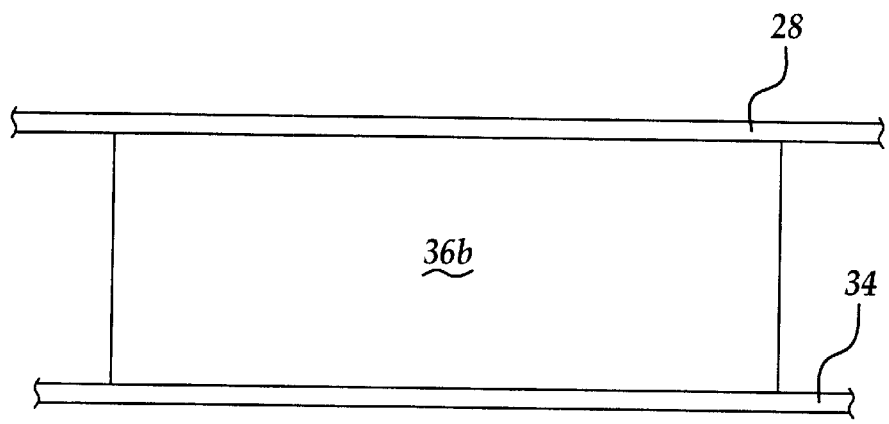
FIG. 8 is a side view of the support shown in FIG. 7.
Figure 9:
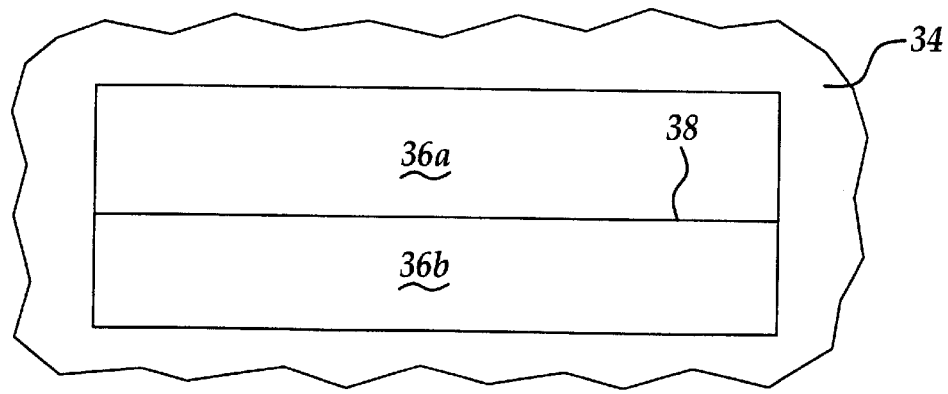
FIG. 9 is a top view of the support shown in FIG. 7, but without the wafer.

Referring now to FIGS. 5–9, the present invention provides a novel hoop support 34 which may be used in the processing station shown in FIG. 1. Hoop support 34 includes three circumferentially spaced, novelly configured supports in a form of pins 36. Each of the pins includes a pair of inclined sides 36a,36b and a base 36c which define a cross-section that is triangular in shape. Sides 36a, 36b preferably form angles with the base 36c respectively designated as A, B at between 60 and 80°. Since the body of the hoop 34 extends parallel to the wafer 26, pin sides 36a, 36b likewise form angles relative to the bottom side of the wafer 28 that are preferably between 60° and 80°. Sides 36a, 36b meet to form an edge 38 that defines the line of contact between the pins 36 and the bottom side of wafer 28. It can be appreciated that the area of the surface 32a of the prior art pin (FIG. 4) is substantially greater than that of the edge 38 of the novel pins 36. The edge 38 extends radially, inwardly toward the center of the wafer 28, as best seen in FIG. 5. The pins 36 are elongate, consequently the edge 38 engages the bottom surface of wafer 28 along a substantial length to provide suitable stability in supporting the wafer 28.

As a result of the fact that the pins 36 only contact the wafer 28 along a single edge, in a line of contact, there is reduced probability for impurities and contaminants to remain along the edge 28. Moreover, because of the sharp acute inclination of the pin sides 36a, 36b relative to the surface of the wafer 28, the possibility of impurities and contaminants is further reduced.

From the foregoing, it is apparent that the novel hoop support described above not only provides for the reliable accomplishment of the objects of the invention but does so in a particularly effective and economical manner. It is recognized, of course that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. Apparatus for supporting a semiconductor wafer during processing of said wafer, comprising:
    a hoop; and
    a plurality of supports on said hoop for supporting said wafer thereon, said supports being spaced apart around the periphery of said hoop, each of said supports engaging said wafer along a line of contact, said line contact extends radially from the outer periphery of said wafer inwardly toward the center of said wafer.

2. The apparatus of claim 1 wherein each of said supports is defined by an elongate member having a triangular cross section.

3. The apparatus of claim 2 wherein each member includes a base and a pair of converging sides defining said triangular cross section, and wherein each of said sides forms an acute angle with said base of between 60 and 80 degrees.

4. The apparatus of claim 1 wherein each of said supports extends radially inwardly from the outer periphery of said hoop.

5. The apparatus of claim 1, wherein each of said supports has a pair of opposing sides tapering toward each other in the direction of said wafer.

6. Apparatus for supporting a semiconductor wafer during an etching operation in which material is etched from the periphery of said wafer, comprising:

a hoop; and a plurality of supports carried on said hoop for supporting said wafer thereon, each of said supports having an upper edge contacting said wafer and a pair of sides extending downwardly and from said edge and diverging away from each other, wherein each of said sides forms an angle with the plane of said wafer of between 60 and 80 degrees.

7. The apparatus of claim 6, wherein said edge defines a line contact between said support and said wafer.

8. The apparatus of claim 7, wherein said line contact extends radially inwardly toward the center of said wafer.

9. The apparatus of claim 6, wherein each of said supports is elongate and possesses a triangular cross section.

10. The apparatus of claim 9, wherein said triangular cross section is formed by the combination of said sides and a base, and wherein the angle between said base and each of said sides is between 60 and 80 degrees.

11. The apparatus of claim 6, wherein each of said supports is defined by an elongate member having a triangular cross section and wherein each member further includes a third side intersecting said pair of sides to form a triangular cross section.

12. The apparatus of claim 11, wherein said third side forms an angle with each of said pair of said of between 60 and 80 degrees.

13. The apparatus of claim 6 wherein each of said supports is spaced radially inward from the outer periphery of said hoop.

* * * * *